United States Patent
Walker et al.

(10) Patent No.: US 9,229,073 B2
(45) Date of Patent: Jan. 5, 2016

(54) SYSTEMS AND METHOD TO SUBSTANTIALLY MITIGATE AC STARK SHIFT EFFECTS IN A SENSOR SYSTEM

(71) Applicants: Thad G. Walker, Madison, WI (US); Michael D. Bulatowicz, Canoga Park, CA (US); Michael S. Larsen, Woodland Hills, CA (US); Robert C. Griffith, Woodland Hills, CA (US); Philip R. Clark, Tarzana, CA (US)

(72) Inventors: Thad G. Walker, Madison, WI (US); Michael D. Bulatowicz, Canoga Park, CA (US); Michael S. Larsen, Woodland Hills, CA (US); Robert C. Griffith, Woodland Hills, CA (US); Philip R. Clark, Tarzana, CA (US)

(73) Assignee: Northrop Grumman Guidance and Electronics Company, Inc., Woodland Hills, CA (US)

( * ) Notice: Subject to any disclaimer, the term of this patent is extended or adjusted under 35 U.S.C. 154(b) by 573 days.

(21) Appl. No.: 13/727,926

(22) Filed: Dec. 27, 2012

(65) Prior Publication Data
US 2014/0184216 A1 Jul. 3, 2014

(51) Int. Cl.
*G01R 33/26* (2006.01)
*G01C 19/62* (2006.01)

(52) U.S. Cl.
CPC ............... *G01R 33/26* (2013.01); *G01C 19/62* (2013.01)

(58) Field of Classification Search
CPC ................................. G01R 33/26; G01C 19/62
See application file for complete search history.

(56) References Cited

U.S. PATENT DOCUMENTS

| | | | |
|---|---|---|---|
| 4,525,672 A * | 6/1985 | Lam | G01N 24/006 324/301 |
| 5,189,368 A * | 2/1993 | Chase | G01R 33/032 102/417 |
| 5,272,436 A * | 12/1993 | Chaillout | G01R 33/26 324/301 |
| 6,269,648 B1 * | 8/2001 | Hasson | A61K 49/1815 62/3.1 |
| 6,359,917 B1 | 3/2002 | Cutler et al. | |
| 6,472,869 B1 * | 10/2002 | Upschulte | G01R 33/26 324/300 |
| 6,566,875 B1 * | 5/2003 | Hasson | G01R 33/282 324/309 |
| 6,831,522 B2 | 12/2004 | Kitching et al. | |

(Continued)

FOREIGN PATENT DOCUMENTS

WO WO 2009/079054 A3 6/2009

OTHER PUBLICATIONS

Fang, J., et al. Light-shift measurement and suppression in atomic spin gyroscope. Applied Optics; 2012; vol. 51, No. 31; pp. 7714-7717.

(Continued)

*Primary Examiner* — Dixomara Vargas
(74) *Attorney, Agent, or Firm* — Tarolli, Sundheim, Covell & Tummino LLP (57) ABSTRACT

One embodiment includes a sensor system. The system includes a cell system comprising a pump laser configured to generate a pump beam to polarize alkali metal particles enclosed within a sensor cell. The system also includes a detection system comprising a probe laser configured to generate a probe beam. The detection system can also be configured to calculate at least one measurable parameter based on characteristics of the probe beam passing through the sensor cell resulting from precession of the polarized alkali metal particles in response to an applied magnetic field. The system further includes an AC Stark shift control system configured to frequency-modulate the pump beam and to control a center frequency of a frequency-modulated pump beam based on the characteristics of the probe beam passing through the sensor cell to substantially stabilize and mitigate the effects of AC Stark shift on the at least one measurable parameter.

20 Claims, 3 Drawing Sheets

(56) References Cited

U.S. PATENT DOCUMENTS

| | | | |
|---|---|---|---|
| 6,995,641 B2 * | 2/2006 | Hasson | A61K 49/1815 335/301 |
| 7,202,751 B2 | 4/2007 | Zhu et al. | |
| 7,239,135 B2 * | 7/2007 | Abbink | G01R 33/26 324/302 |
| 7,826,065 B1 * | 11/2010 | Okandan | G01B 11/02 324/244.1 |
| 7,929,586 B2 * | 4/2011 | Canham | H01S 3/0387 372/37 |
| 8,050,301 B2 | 11/2011 | Wells et al. | |
| 8,054,073 B2 | 11/2011 | Tuchman | |
| 8,159,220 B2 * | 4/2012 | Bulatowicz | G01C 19/62 324/304 |
| 8,212,556 B1 * | 7/2012 | Schwindt | G01R 33/26 324/301 |
| 8,600,691 B2 * | 12/2013 | Griffith | G01C 19/62 324/302 |
| 8,698,493 B2 * | 4/2014 | Walker | G01C 19/62 324/307 |
| 2002/0175767 A1 | 11/2002 | Kitching et al. | |
| 2006/0083277 A1 | 4/2006 | Zhu et al. | |
| 2010/0156547 A1 | 6/2010 | McGuyer et al. | |
| 2010/0289491 A1 | 11/2010 | Budker et al. | |
| 2011/0194577 A1 | 8/2011 | Wells et al. | |

OTHER PUBLICATIONS

Bulatowicz, M., et al. Compact Atomic Magnetometer for Global Navigation (NAV-CAM). Proceedings of IEEE/Ion Plans, Manassas, VA; Apr. 26, 2012; pp. 1088-1093.

Affolderbach, C., et al. Light shift reduction in atomic clocks. Proceedings of the SPIE—The International Society for Optical Engineering SPIE-INT. Soc. Opt. Eng. USA; Jun. 21, 2004; vol. 5449, No. 1; pp. 342-349.

European Search Report for corresponding application EP13197071 dated Apr. 28, 2014.

* cited by examiner

SYSTEMS AND METHOD TO SUBSTANTIALLY MITIGATE AC STARK SHIFT EFFECTS IN A SENSOR SYSTEM

TECHNICAL FIELD

The present invention relates generally to sensor systems, and specifically to systems and a method to substantially mitigate AC Stark shift effects in a sensor system.

BACKGROUND

Sensor systems, such as nuclear magnetic resonance (NMR) gyroscopes and magnetometers and/or electron paramagnetic resonance (EPR) magnetometers, can include a cell that contains one or more alkali metal vapors, such as rubidium or cesium, together with one or more nuclear spin isotopes that are caused to precess in response to a magnetic field. The alkali metal vapor(s) can be stimulated to an excited state in response to optical pumping in a given frequency band. Thus, the alkali metal vapor can be subject to AC Stark shift, in which the atoms of the alkali metal vapor are optically pumped with light that is off resonance with respect to an atomic transition wavelength, causing a virtual magnetic field to be experienced by the alkali metal vapor but not by the nuclear spin isotopes. The resultant effect of the AC Stark shift is an added bias in the detected magnetic field of the associated magnetometer or an added bias in the rotation angle and/or rate of the associated gyroscope, and thus errors in their respective measurable parameters. Because alkali metals have two independent ground states, and thus two separate atomic transition frequencies, AC Stark shift is unavoidable in the optical pumping of the alkali metals.

SUMMARY

One embodiment of the invention includes a sensor system. The system includes a cell system comprising a pump laser configured to generate a pump beam to polarize alkali metal particles enclosed within a sensor cell. The system also includes a detection system comprising a probe laser configured to generate a probe beam. The detection system can also be configured to calculate at least one measurable parameter based on characteristics of the probe beam passing through the sensor cell resulting from precession of the polarized alkali metal particles in response to an applied magnetic field. The system further includes an AC Stark shift control system configured to frequency-modulate the pump beam and to control a center frequency of a frequency-modulated pump beam based on the characteristics of the probe beam passing through the sensor cell to substantially stabilize and mitigate the effects of AC Stark shift on the at least one measurable parameter.

Another embodiment of the invention includes a method for substantially mitigating AC Stark shift effects in a sensor system configured to calculate at least one measurable parameter. The method includes providing a pump beam through a sensor cell comprising alkali metal particles and modulating a frequency of the pump beam about a center frequency based on a substantially stable frequency reference. The method also includes providing a linearly-polarized probe beam through the sensor cell and demodulating a frequency of a Faraday rotation of the linearly-polarized probe beam based on the substantially stable frequency reference to generate a frequency offset. The method further includes controlling a center frequency of the frequency-modulated pump beam by the frequency offset to substantially stabilize and mitigate the effects of AC Stark shift on the at least one measurable parameter.

Another embodiment of the invention includes a sensor system. The system includes a cell system comprising a pump laser configured to generate a pump beam having a frequency that is based on a magnitude of a current to polarize alkali metal particles enclosed within a sensor cell. The system also includes a detection system comprising a probe laser configured to generate a probe beam. The detection system can also be configured to calculate at least one measurable parameter based on characteristics of the probe beam passing through the sensor cell resulting from precession of the polarized alkali metal particles in response to an applied magnetic field. The system further includes an AC Stark shift control system configured to monitor an absorption voltage corresponding to optical absorption of the pump beam passing through the sensor cell to determine a substantial maximum optical absorption of the pump beam passing through the sensor cell, the AC Stark shift control system being further configured to modulate the magnitude of the current to frequency-modulate the pump beam based on a substantially stable frequency reference and to control a center frequency of the frequency-modulated pump beam based on a Faraday rotation of the probe beam passing through the sensor cell to substantially stabilize and mitigate the effects of AC Stark shift on the at least one measurable parameter.

DETAILED DESCRIPTION

The present invention relates generally to sensor systems, and specifically to systems and a method to substantially mitigate AC Stark shift effects in a sensor system. A sensor system, such as a nuclear magnetic resonance (NMR) gyroscope, an NMR magnetometer, or an electron paramagnetic resonance (EPR) magnetometer, can include a cell system that includes a pump laser configured to generate a pump beam to polarize alkali metal particles enclosed within a sensor cell. A detection system can be configured to calculate at least one measurable parameter, such as rotation about a sensitive axis or an external magnetic field, based on precession of the polarized alkali metal particles in response to an applied magnetic field. As an example, the precession of the polarized alkali metal particles can be coupled with precession of nuclear spin isotopes such as xenon (e.g., $^{129}$Xe or $^{131}$Xe), such that the Larmor precession frequency and/or phase information of the one or more nuclear spin isotopes can be extracted to calculate the measurable parameter. The sensor system can also include an AC Stark shift control system configured to monitor optical absorption of the pump beam passing through the sensor cell and to modulate a frequency of the pump beam to substantially mitigate the effects of AC Stark shift on the at least one measurable parameter.

The monitoring of the optical absorption can be based on linearly polarized light associated with the pump beam exiting the sensor cell being incident on a photodetector. Thus, a substantially stable frequency reference can be implemented to modulate the frequency of the pump beam. A center frequency of the frequency-modulated pump beam can be set to approximately a frequency value of substantial maximum absorption of the pump beam passing through the sensor cell. The frequency-modulated pump beam can induce a magnetic field within the sensor cell that affects the precession of the alkali metal particles in a manner that is associated with the AC Stark shift effects at a frequency of the substantially stable frequency reference. Therefore, a probe beam that is provided through the sensor cell that can exhibit characteristics associated with the at least one measurable parameter can have a Faraday rotation at approximately the same frequency as the substantially stable frequency reference. Therefore, the frequency of the Faraday rotation can be demodulated based on the substantially stable frequency reference to generate a DC error signal corresponding to the effects of the AC Stark shift. Accordingly, the center frequency of the frequency-modulated pump beam can be shifted based on the DC error signal to maintain the center frequency at a value at which the effects of the AC Stark shift are equal and opposite with respect to the two independent ground states of the alkali metal in a feedback manner. As a result, the AC Stark shift is substantially stabilized, such that the time-averaged effects of the AC Stark shift are substantially mitigated with respect to the at least one measurable parameter.

Figure 1:
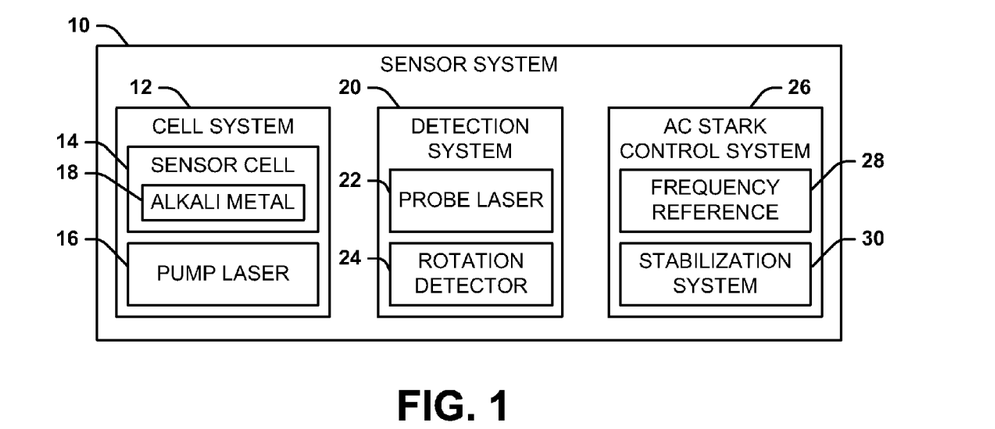
FIG. 1 illustrates an example of a sensor system in accordance with an aspect of the invention.

FIG. 1 illustrates an example of a sensor system 10 in accordance with an aspect of the invention. As an example, the sensor system 10 can correspond to one or more of a nuclear magnetic resonance (NMR) gyroscope, an NMR magnetometer, an electron paramagnetic resonance (EPR) magnetometer, or a combination thereof. The sensor system 10 can be implemented in any of a variety of applications, such as detection, guidance, and/or aviation systems. As another example, the sensor system 10 can be implemented as a portion of an overall sensor application, such as can be configured to operate in multiple axes.

The sensor system 10 includes a cell system 12 that includes a sensor cell 14 and a pump laser 16. The sensor cell 14 can be, for example, a glass casing of any of a variety of shapes and sizes. The sensor cell 14 includes an alkali metal 18, as well as one or more nuclear spin isotopes (not shown) in the case of an NMR sensor. As an example, the alkali metal 18 can be rubidium (Rb) vapor, such as $^{85}$Rb, or cesium (Cs) vapor, such as $^{133}$Cs, and the nuclear spin isotope(s) can include noble gas isotopes such as helium (He), krypton (Kr), and/or xenon (Xe) (e.g., $^{3}$He, $^{83}$Kr $^{129}$Xe, and/or $^{131}$Xe). The pump laser 16 can be configured to generate an optical pump beam that is circularly-polarized and directed through the sensor cell 14 via a set of optics to stimulate (i.e., excite) the particles of the alkali metal 18 to a polarized state. The polarized particles of the alkali metal 18 can precess in the sensor cell 14 in response to an applied magnetic field (e.g., an AC and/or DC magnetic field applied along a sensitive axis), such as may be generated by the precessing nuclear spin isotopes. For example, the polarized particles of the alkali metal 18 can experience EPR precession due to a DC or AC magnetic field along an EPR sensitive axis (e.g., the X- and/or Y-axis) that is stimulated by the applied magnetic field (e.g., a DC and AC magnetic field resonant with the EPR Larmor precession frequency along the EPR insensitive Z-axis), and the nuclear spin isotopes can precess about the applied magnetic field (e.g., a DC magnetic field along the EPR insensitive Z-axis) in response to a magnetic field resonant with the NMR Larmor precession frequency or frequencies applied in the X-Y plane. Furthermore, the sensor cell 14 can also include one or more buffer gases.

The sensor system 10 also includes a detection system 20 that is configured to calculate at least one measurable parameter. For example, the measurable parameter can include rotation about a sensitive axis in the example of the sensor system 10 being configured as an NMR gyroscope, or can include a vector magnitude of an external magnetic field in the example of the sensor system 10 being configured as an NMR and/or EPR magnetometer. In the example of FIG. 1, the detection system 20 includes a probe laser 22 and a rotation detector 24. The probe laser 22 can be configured to generate a probe beam that passes through the sensor cell 14. The precession of the particles of the alkali metal 18 and the associated nuclear spin isotopes can result in polarization phase changes associated with the probe beam exiting the sensor cell 14 (e.g., based on interaction between the photons from the probe laser 22 and the particles of the alkali metal 18). Therefore, the detection system 20 can calculate the measurable parameter based on changes in the precession of the particles of the alkali metal 18, such as resulting from rotation of the sensor cell 14 or an external magnetic field, such as based on the rotation detector 24 determining a Faraday rotation of the probe beam.

The particles of the alkali metal 18 can be subject to AC Stark shift, in which the optical pumping of the particles of the alkali metal 18 via the pump laser 16 is off resonance with respect to atomic transition wavelengths corresponding to two independent ground states of the alkali metal 18. The AC Stark shift can cause a virtual magnetic field that is experienced by the alkali metal 18 but not by the nuclear spin isotopes, which causes a change to the precession of the particles of the alkali metal 18 relative to the nuclear spin isotopes. As a result, the AC Stark shift exhibits an added bias to the measurable parameter that is calculated by the detection system 20. The virtual magnetic field is added to the applied magnetic field, such that if the AC Stark shift is stable, and if the sensor system 10 is tuned to an optimum operating point, the sensor system 10 experiences substantially no scale factor or bias errors arising from AC Stark shift effects. However, changes in intensity, frequency, and/or alignment of the optical pump beam, as well as vapor density of the alkali metal 18 (e.g., based on temperature of the sensor cell 14), can result in changes in the virtual magnetic field caused by the AC Stark shift, and thus changes in an overall magnitude of the applied magnetic field experienced by the alkali metal 18.

In the example of the sensor system 10 being configured as a magnetometer, the sensitive axes of the magnetometer are defined based on an interaction of the particles of the alkali metal 18 relative to the applied magnetic field, as determined by the detection system 20. For example, the detection system 20 can demodulate a detection signal at a typically fixed phase relationship with the applied magnetic field, such that changes in the phase of the precession of the particles of the alkali metal 18 result in changes to the detection signal based on interaction of the probe beam and the precessing particles of the alkali metal 18 in the sensor cell 14. However, the effect of an unstable AC Stark shift with respect to changing the precession of the particles of the alkali metal 18 can result in a change in the magnetometer signal phase that can be perceived as components of an external magnetic field in vector angles rotated about the sensitive axis.

In the example of the sensor system 10 being configured as a gyroscope, magnetic field feedback can be implemented to substantially null any detected magnetic fields in a cross-axis relative to the sensitive axis to maintain alignment of the sensitive axis to the applied magnetic field. Thus, a virtual magnetic field in a cross-axis direction caused by unstable AC Stark shift can be indistinguishable from a real magnetic field, such that the feedback system can generate a real magnetic field to offset the perceived virtual magnetic field. As described previously, the nuclear spin isotopes in the sensor cell 14 are not subject to effects of the virtual magnetic field, but are subject to the effects of a real magnetic field generated to offset the virtual magnetic field. As a result, the offset real magnetic field can cause misalignment, and thus instability, of the sensitive axis of the gyroscope. Furthermore, the presence of AC Stark Shift effects can alter the phase of the precession of the particles of the alkali metal 18 with respect to the precession of the nuclear spin isotopes. This phase offset can result in a phase offset in the feedback for stimulation of the precession of the nuclear spin isotopes, which can result in an angular rate bias.

To substantially stabilize and mitigate the effects of AC Stark shift, the sensor system 10 includes an AC Stark shift control system 26. The AC Stark shift control system 26 includes a frequency reference 28 and a stabilization system 30. The frequency reference 28 can be configured as any of a variety of substantially stable frequency generators (e.g., a crystal oscillator or an atomic clock) to provide a relatively low frequency (e.g., between approximately 8 and 12 kHz) dither signal to the stabilization system 30. The stabilization system 30 is configured to modulate the frequency of the optical pump beam provided by the pump laser 16, such that the absorption of the optical pump beam passing through the sensor cell 14 varies inter alia as a function of the frequency of the dither signal. The stabilization system 30 is also configured to monitor the absorption of the optical pump beam passing through the sensor cell 14, such as based on a set of optics and a photodetector, to determine one or more frequencies of the optical pump beam corresponding to substantial maximum absorption of the optical pump beam passing through the sensor cell 14, thus corresponding to the transition frequencies associated with the independent ground states of the alklali metal 18.

Upon obtaining the frequency of substantial maximum absorption, the stabilization system 30 can initially set a center frequency of the frequency-modulated optical pump beam to be approximately equal to the frequency of substantial maximum absorption. The frequency-modulated pump beam can induce a magnetic field internal to the sensor cell 14 that affects the precession of the particles of the alkali metal 18 in a manner that is associated with the AC Stark shift effects, modulated at the same frequency of the dither signal generated by frequency reference 28. For example, the pump laser 16 can be oriented in a manner to provide components of the induced magnetic field in a plane that is orthogonal to an axis about which the particles of the alkali metal 18 precess. Therefore, the probe beam that is generated by the probe laser 22 can exhibit a Faraday rotation at approximately the same frequency as the dither signal in response to the induced magnetic field in addition to a Faraday rotation based on the measurable parameter (e.g., which can occur at a much lower frequency). Therefore, the stabilization system 30 can demodulate the frequency of the Faraday rotation of the probe beam based on the dither signal to generate a DC error signal that can correspond to the effects of the AC Stark shift. Accordingly, the center frequency of the frequency-modulated pump beam can be shifted based on the DC error signal to maintain the center frequency at a value at which the effects of the AC Stark shift are equal and opposite with respect to the two independent ground states of the alkali metal 18 in a feedback manner. Accordingly, based on the feedback modulation of the pump beam by the stabilization system 30, the stabilization system 30 stabilizes the AC Stark shift. Furthermore, because the AC Stark shift effects are substantially equal and opposite with respect to excitation of the alkali metal 18 from the respective two independent ground states of the alkali metal 18, the AC Stark shift effects are substantially mitigated. Accordingly, scale factor and bias errors associated with the measurable parameter(s) of the sensor system 10 is likewise substantially mitigated.

Figure 2:
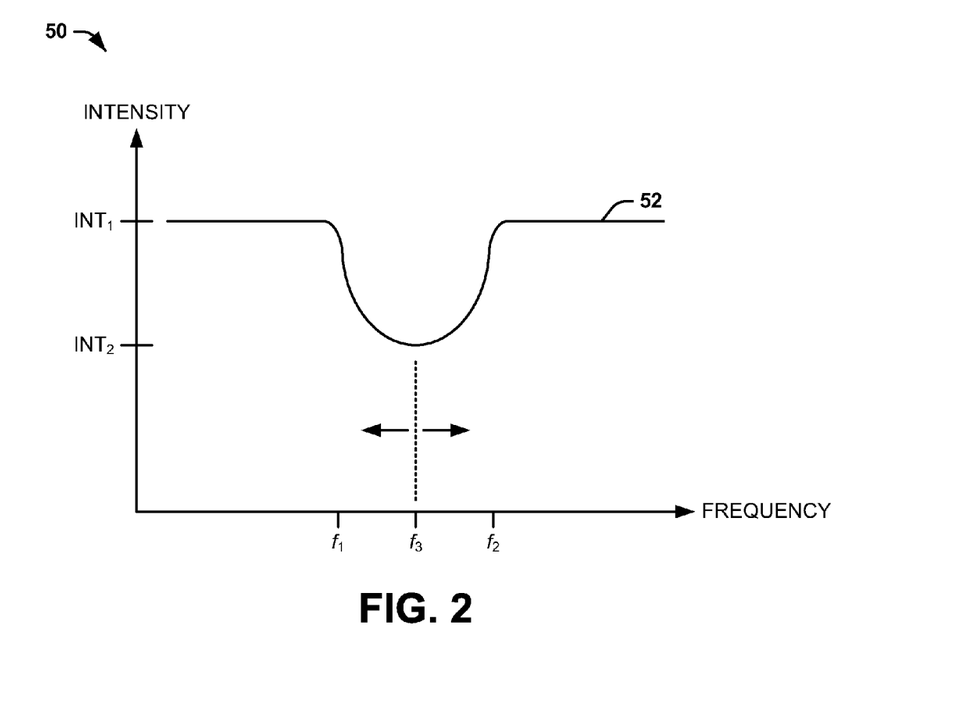
FIG. 2 illustrates an example of an absorption spectrum in accordance with an aspect of the invention.

FIG. 2 illustrates an example of an absorption spectrum 50 in accordance with an aspect of the invention. The absorption spectrum 50 in the example of FIG. 2 demonstrates an intensity of optical pump beam, demonstrated at 52, as a function of frequency, and thus absorption of the photons of the optical pump beam by the particles of the alkali metal 18 based on frequency. As an example, the absorption spectrum 50 can correspond to an absorption spectrum of the alkali metal 18 being provided as $^{85}$Rb. The absorption spectrum 50 can be determined based on the frequency modulation of the optical pump beam, such that the intensity of the pump beam exiting the sensor cell can be monitored by a photodetector.

The absorption spectrum 50 demonstrates a first intensity $INT_1$ and a second intensity $INT_2$ of the optical pump beam, such as measured by one or more photodetectors in the AC Stark shift control system 26. Specifically, in the example of FIG. 2, the optical pump beam exhibits a decrease in intensity from the intensity $INT_1$ to the intensity $INT_2$ between a first frequency $f_1$ and a second frequency $f_2$, demonstrated in the example of FIG. 2 as being an approximate Gaussian distribution of the intensity of the optical pump beam between the first and second intensities $INT_1$ and $INT_2$. Therefore, the alkali metal 18 absorbs more photons of the optical pump beam when the optical pump beam has a frequency between the first and second frequencies $f_1$ and $f_2$, with a substantial maximum absorption at a frequency $f_3$. As an example, the frequency band between the first and second frequencies $f_1$ and $f_2$ can include the two transition frequencies of the $^{85}$Rb alkali metal 18, such that each of the transition frequencies can be close in value to the frequency $f_3$. Therefore, because of the presence of one or more buffer gases in the sensor cell 14, the absorption peaks of the transition frequencies of the $^{85}$Rb alkali metal 18 can be blurred and encapsulated within the frequency band between the first and second frequencies $f_1$ and $f_2$.

Upon determining the substantial maximum optical absorption of the pump beam, which in the example of FIG. 2 corresponds to the frequency $f_3$, the stabilization controller 30 can be configured to initially set the center frequency of the frequency-modulated pump beam to the frequency of the substantial maximum optical absorption. In the example of FIG. 2, the center frequency can be set to the frequency $f_3$, which can correspond to an approximate center of the frequency band between the first and second frequencies $f_1$ and $f_2$.

Upon setting the center frequency of the frequency-modulated pump beam to the frequency $f_3$, the Faraday rotation frequency of the probe beam generated by the probe laser 22 can be demodulated by the stabilization system 30 based on the dither signal. Therefore, the demodulated Faraday rotation frequency of the probe beam can result in a DC error signal that can correspond to the effects of the AC Stark shift. Accordingly, the stabilization system 30 can shift the center frequency of the frequency-modulated pump beam based on the DC error signal, such as based on a sign of the DC error signal, which can be indicative of whether the center frequency should be shifted to increase the center frequency or decrease the center frequency. Upon the DC error signal being approximately equal to zero, the center frequency is at a frequency value at which the effects of the AC Stark shift are equal and opposite with respect to excitation of the particles of the $^{85}$Rb alkali metal 18 out of the two independent ground states.

The optical absorption of the optical pump beam by the $^{85}$Rb alkali metal 18 can vary for a variety of reasons, such as temperature, intensity of the magnetic field, and/or other reasons. Therefore, the frequency at which the effects of the AC Stark shift are substantially equal and opposite can change over time. Accordingly, the stabilization system 30 can operate in a feedback manner to maintain the center frequency of the frequency-modulated pump beam to the frequency at which the effects of the AC Stark shift are substantially equal and opposite with respect to the two independent ground states of the $^{85}$Rb alkali metal 18. For example, the stabilization system 30 can continuously monitor the demodulated probe beam, and thus the DC error signal, to continuously shift the center frequency to maintain the DC error signal at an approximate zero, and thus maintain the center frequency at the frequency value of equal and opposite AC Stark shift effects, in a feedback manner. As a result, the stabilization system 30 operates to stabilize the effects of the AC Stark shift in a feedback manner, such that the stabilization system 30 can maintain mitigation of the time-averaged effects of the AC Stark shift over time.

As described previously, the absorption spectrum 50 in the example of FIG. 2 can correspond to an absorption spectrum of the $^{85}$Rb alkali metal 18. However, it is to be understood that the alkali metal 18 is not intended to be limited to the use of $^{85}$Rb. For example, in case of the alkali metal 18 being $^{133}$Cs, the AC Stark shift control system 26 can determine two frequencies of substantial maximum absorption corresponding to the two respective transition frequencies associated with the independent ground states of the $^{133}$Cs, such that the two transition frequencies are not blurred by buffer gases to create a single frequency band. Therefore, the cell system 12 can implement two separate pump lasers 16 that are each initially tuned to the respective maximum absorption peaks corresponding to the transition frequencies of the $^{133}$Cs alkali metal. As another example, a single pump laser 16 can be tuned to a frequency between the maximum absorption peaks, but can pump the $^{133}$Cs alkali metal at a sufficiently high power to sufficiently pump the $^{133}$Cs alkali metal off resonance of both the transition frequencies. For the example of two pump beams, the stabilization system 30 can generate separate dither signals for each of the pump beams, such that the probe beam can be demodulated by the separate dither signals to allow the center frequencies of each of the pump beams to be separately shifted to substantially stabilize and mitigate the AC Stark shift effects with respect to each of the pump beams.

Figure 3:
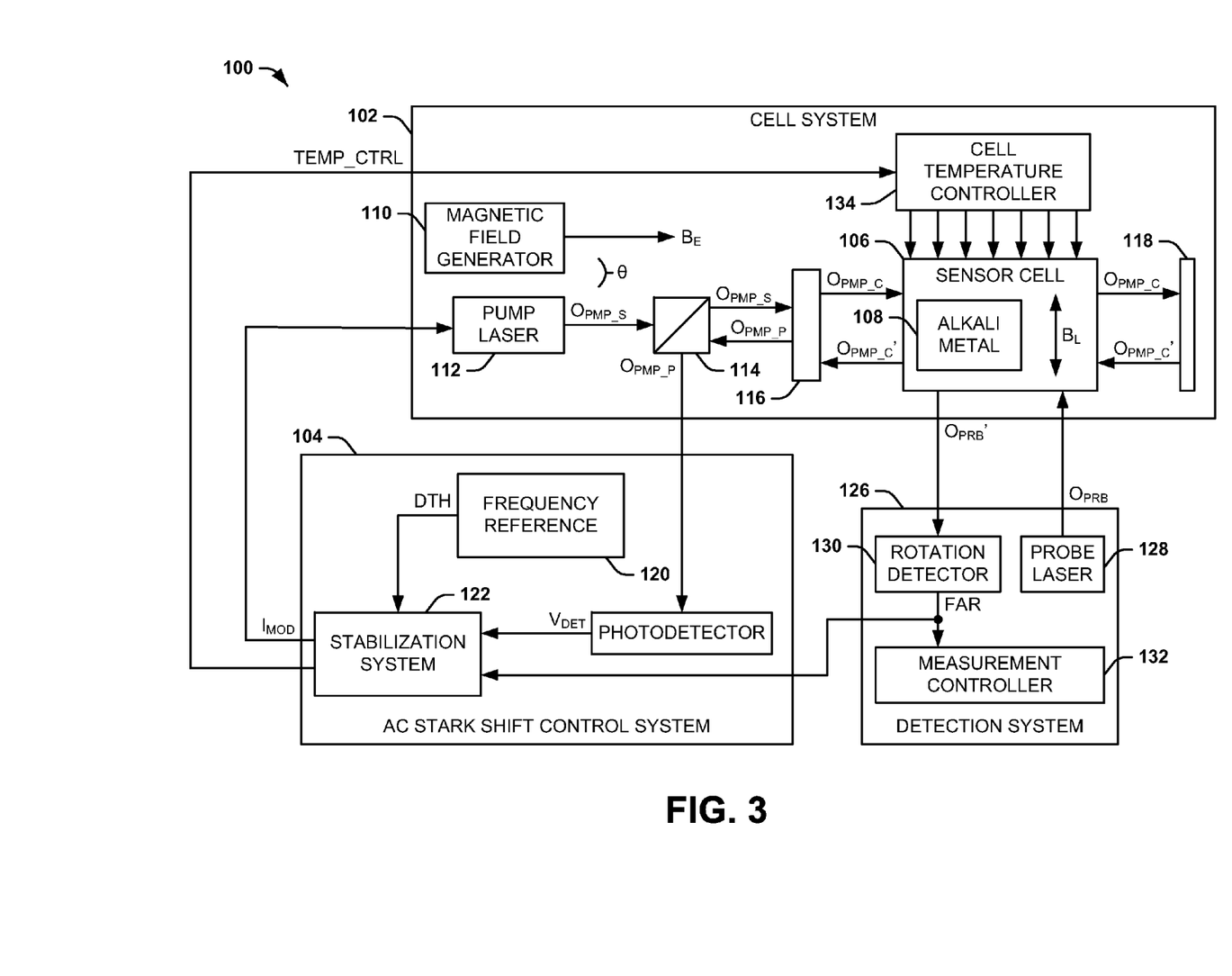
FIG. 3 illustrates another example of a sensor system in accordance with an aspect of the invention.

FIG. 3 illustrates another example of a sensor system 100 in accordance with an aspect of the invention. As an example, the sensor system 100 can correspond to a portion of an NMR gyroscope, an NMR magnetometer, an EPR magnetometer, or a combination thereof. The sensor system 100 can be implemented in any of a variety of applications, such as detection, guidance, and/or aviation systems. As another example, the sensor system 100 can be implemented as a portion of an overall sensor application, such as can be configured to operate in multiple axes.

The sensor system 100 includes a cell system 102 and an AC Stark shift control system 104. In the example of FIG. 3, the cell system 102 includes a sensor cell 106. The sensor cell 106 can be, for example, a glass casing of any of a variety of shapes and sizes. The sensor cell 106 includes an alkali metal 108, as well as one or more nuclear spin isotopes (not shown), in the example of the sensor system 100 being configured as an NMR system. As an example, the alkali metal 108 can be Rb vapor, such as $^{85}$Rb, to substantially minimize a difference between the transition frequencies of the alkali metal 108 relative to other alkali metal types (e.g., Cs), as described previously in the example of FIG. 2. In addition, as an example, the nuclear spin isotope(s) can include noble gas isotopes. The cell system 102 also includes a magnetic field generator 110 that is configured to generate a magnetic field $B_E$. As an example, the magnetic field generator 110 can be configured as a magnetic solenoid that substantially surrounds the sensor cell 106 to generate the magnetic field $B_E$ as a substantially uniform magnetic field. In response to the magnetic field $B_E$, the particles of the alkali metal 108 and the nuclear spin isotopes can precess relative to an axis of the sensor cell 106.

The cell system 102 also includes a pump laser 112. The pump laser 112 can be configured to generate an optical pump beam $O_{PMP\_S}$ having a linear polarization (e.g., the "s" polarization). The optical pump beam $O_{PMP\_S}$ is directed through a beamsplitter 114 and a quarter-wave plate 116. The quarter-wave plate 116 is configured to change the linear polarization of the optical pump beam $O_{PMP\_S}$ to a circular polarization, demonstrated as the optical pump beam $O_{PMP\_C}$. The optical pump beam $O_{PMP\_C}$ is directed through the sensor cell 106 to stimulate (i.e., excite) the particles of the alkali metal 108 to a polarized state. In the example of FIG. 3, the optical pump beam $O_{PMP\_C}$ is directed through the sensor cell 106 twice based on reflection of the optical pump beam $O_{PMP\_C}$ from a minor 118 at a distal side of the sensor cell 106, with the reflected optical pump beam being demonstrated as $O_{PMP\_C}'$. Thus, optical pumping of the particles of the alkali metal 108 can be substantially increased.

The reflected optical pump beam $O_{PMP\_C}'$ exiting the sensor cell 106 is directed through the quarter-wave plate 116, thus transforming the circular polarization to a linear polarization. However, the linear polarization of the optical pump beam is oriented orthogonally with respect to the optical pump beam $O_{PMP\_S}$ provided by the pump laser 112, and is thus demonstrated as optical pump beam $O_{PMP\_P}$ to denote the "p" polarization. Therefore, upon being provided to the beamsplitter 114, the optical pump beam $O_{PMP\_P}$ is reflected and directed to the AC Stark shift control system 104. Accordingly, the AC Stark shift control system 104 can monitor optical absorption of the optical pump beam $O_{PMP\_C}$ based on the intensity of the optical pump beam $O_{PMP\_P}$. As described herein, optical absorption of the optical pump beam $O_{PMP\_C}$ denotes a collective optical absorption of the optical pump beams $O_{PMP\_C}$ and $O_{PMP\_C}'$.

As described herein, the particles of the alkali metal 108 can be subject to AC Stark shift, in which the optical pumping of the particles of the alkali metal 108 via the pump laser 112 is off resonance with respect to atomic transition wavelengths corresponding to two independent ground states of the alkali metal 108. To ensure that the AC Stark shift is measurable, the pump laser 112 can be oriented to generate the optical pump beam $O_{PMP\_C}$ at an offset angle θ with respect to the applied magnetic field $B_E$. For example, the pump laser 112 can be physically oriented at the offset angle θ, such that the optical pump beam $O_{PMP\_C}$ is provided through the sensor cell 106 at the offset angle θ, or the cell system 102 can include additional optics to provide the optical pump beam $O_{PMP\_C}$ through the sensor cell 106 at the offset angle θ.

The AC Stark shift control system 104 includes a frequency reference 120, a stabilization system 122, and a photodetector 124. The frequency reference 120 can be configured as any of a variety of substantially stable frequency generators (e.g., a crystal oscillator or an atomic clock) to provide a relatively low frequency (e.g., between approximately 8 and 12 kHz) dither signal DTH to the stabilization system 122. The stabilization system 122 is configured to generate a modulation current $I_{MOD}$ that is provided to the pump laser 112. Therefore, the amplitude and frequency of the pump laser 112 can be set based on a magnitude of the modulation current $I_{MOD}$. The stabilization system 122 can thus modulate the magnitude of the modulation current $I_{MOD}$ based on the dither signal DTH. As a result, the frequency of the optical pump beam $O_{PMP\_S}$ provided by the pump laser 112 is modulated, such that the absorption of the optical pump beam $O_{PMPC}$ varies inter alia as a function of the frequency of the dither signal DTH, as demonstrated in the example of FIG. 2.

The optical pump beam $O_{PMP\_P}$ is provided from the beamsplitter 114 to the photodetector 124, such that the photodetector 124 is configured to generate an absorption voltage $V_{DET}$ that corresponds to the intensity of the optical pump beam $O_{PMP\_P}$, which thus corresponds to the absorption of the optical pump beam $O_{PMP\_C}$ in the sensor cell 106. The absorption voltage $V_{DET}$ is provided to the stabilization system 122, such that the stabilization system 122 can monitor the absorption of the optical pump beam $O_{PMP\_C}$ based on the absorption voltage $V_{DET}$. Because the frequency of the optical pump beam $O_{PMP\_C}$ varies based on the dither signal DTH, the absorption voltage $V_{DET}$ likewise varies at approximately the same frequency (e.g., based on the dither signal DTH). Therefore, the stabilization system 122 can be configured to determine the absorption spectrum of the optical pump beam $O_{PMP\_P}$. As a result, the stabilization system 122 can determine a frequency of the optical pump beam $O_{PMP\_S}$ generated by the pump laser 112 that corresponds to substantial maximum absorption of the optical pump beam $O_{PMP\_C}$ through the sensor cell 106 (e.g., the center of the frequency band between the transition frequencies).

In the example of FIG. 3, the sensor system 100 also includes a detection system 126 that is configured to calculate at least one measurable parameter. For example, the measurable parameter can include rotation about a sensitive axis in the example of the sensor system 100 being configured as an NMR gyroscope, or can include a vector magnitude of an external magnetic field in the example of the sensor system 100 being configured as an NMR/EPR magnetometer. In the example of FIG. 3, the detection system 126 includes a probe laser 128, a rotation detector 130, and a measurement controller 132. The probe laser 128 can be configured to generate a probe beam $O_{PRB}$ that passes through the sensor cell 106. The precession of the particles of the alkali metal 108 and the associated nuclear spin isotopes can result in phase changes associated with the probe beam exiting the sensor cell 106, demonstrated in the example of FIG. 3 as $O_{PRB}'$. The probe beam $O_{PRB}'$ exiting the sensor cell 106 is provided to the rotation detector 130, which is configured to generate a signal FAR that is indicative of the Faraday rotation of the probe beam $O_{PRB}'$. Therefore, the measurement controller 132 can calculate the measurable parameter based on changes in the precession of the particles of the alkali metal 108, such as resulting from rotation of the sensor cell 106 or an external magnetic field, which is indicated by the Faraday rotation of the probe beam $O_{PRB}'$ as provided by the signal FAR.

In addition, as described previously, the optical pump beam $O_{PMP\_C}$ can be oriented at an offset angle θ with respect to the applied magnetic field $B_E$. As a result, the AC Stark shift induces an AC magnetic field $B_L$ in a vector direction that is orthogonal to the applied magnetic field $B_E$ based on vector components of the optical pump beam $O_{PMP\_C}$ in the plane orthogonal to the applied magnetic field $B_E$. The AC magnetic field $B_L$ can have a frequency that is approximately equal to the frequency of the dither signal DTH based on the frequency-modulation of the optical pump beam $O_{PMP\_S}$. Therefore, the AC magnetic field $B_L$ can affect the precession of the alkali metal 108 at the frequency of the dither signal DTH. As a result, in addition to the Faraday rotation of the probe beam $O_{PRB}'$ resulting from the rotation of the sensor cell 106 or an external magnetic field, the probe beam $O_{PRB}'$ can have a Faraday rotation having a frequency that is substantially equal to the frequency of the dither signal DTH resulting from the induced magnetic field $B_L$.

The rotation detector 130 can thus also provide the signal FAR to the stabilization system 122. Thus, the stabilization system 122 can be configured to demodulate the signal FAR based on the dither signal DTH, such that the stabilization system 122 can determine an effect of the AC Stark shift on the probe beam $O_{PRB}'$. The stabilization system 122 can thus obtain a DC error signal having a magnitude and a sign that corresponds to a deviation of the center frequency of the optical pump beam $O_{PMP\_S}$ from the frequency value at which the effects of the AC Stark shift are equal and opposite. As a result, the stabilization system 122 can shift the center frequency of the pump beam $O_{PMP\_S}$ based on the DC error signal to substantially minimize the DC error signal in a feedback manner. Thus, upon the DC error signal being approximately equal to zero, the center frequency is approximately equal to the frequency value at which the effects of the AC Stark shift are approximately equal and opposite with respect to excitation of the particles of the alkali metal 108 out of the two independent ground states.

Therefore, the stabilization system 122 can continuously demodulate the signal FAR to monitor the Faraday rotation of the probe beam $O_{PRB}'$ at the dither signal DTH frequency and can adjust the center frequency of the modulated frequency of the optical pump beam $O_{PMP\_S}$ based on the modulation current $I_{MOD}$ in a feedback manner. As a result, the center frequency of the frequency-modulated optical pump beam $O_{PMP\_S}$, and thus the optical pump beam $O_{PMP\_C}$, is maintained centered at a frequency at which the effects of the AC Stark shift are equal and opposite with respect to the two independent ground states of the alkali metal 108. Accordingly, based on the feedback modulation of the optical pump beam $O_{PMP\_S}$ by the stabilization system 122, the stabilization system 122 stabilizes the AC Stark shift. Furthermore, because the AC Stark shift effects are substantially equal and opposite with respect to excitation of the alkali metal 108 from the respective two independent ground states of the alkali metal 108, the AC Stark shift effects are substantially mitigated. Accordingly, scale factor and bias errors associated with the measurable parameter(s) of the sensor system 100 is likewise substantially mitigated.

In addition, as described previously, absorption of the optical pump beam $O_{PMP\_C}$ is based in part on temperature of the sensor cell 106. In the example of FIG. 3, the cell system 102 also includes a cell temperature controller 134 that is configured to set the temperature of the sensor cell 106. The stabilization system 122 can be configured to stabilize the temperature of the sensor cell 106 via the cell temperature controller 134 based on the monitored absorption of the optical pump beam $O_{PMP\_C}$ via the absorption voltage $V_{DET}$. As an example, the stabilization system 122 can determine changes in the absorption of the optical pump beam $O_{PMP\_C}$ based on the demodulated absorption voltage $V_{DET}$ and can provide a temperature control signal TEMP_CTRL to the cell temperature controller 134 to modify the temperature of the sensor cell 106 to substantially compensate for the changes in absorption of the optical pump beam $O_{PMP\_C}$. Therefore, the stabilization system 122 can likewise stabilize the temperature of the sensor cell 106 based on the absorption voltage $V_{DET}$ in a feedback manner to provide for substantially optimal absorption of the optical pump beam $O_{PMP\_C}$.

Figure 4:
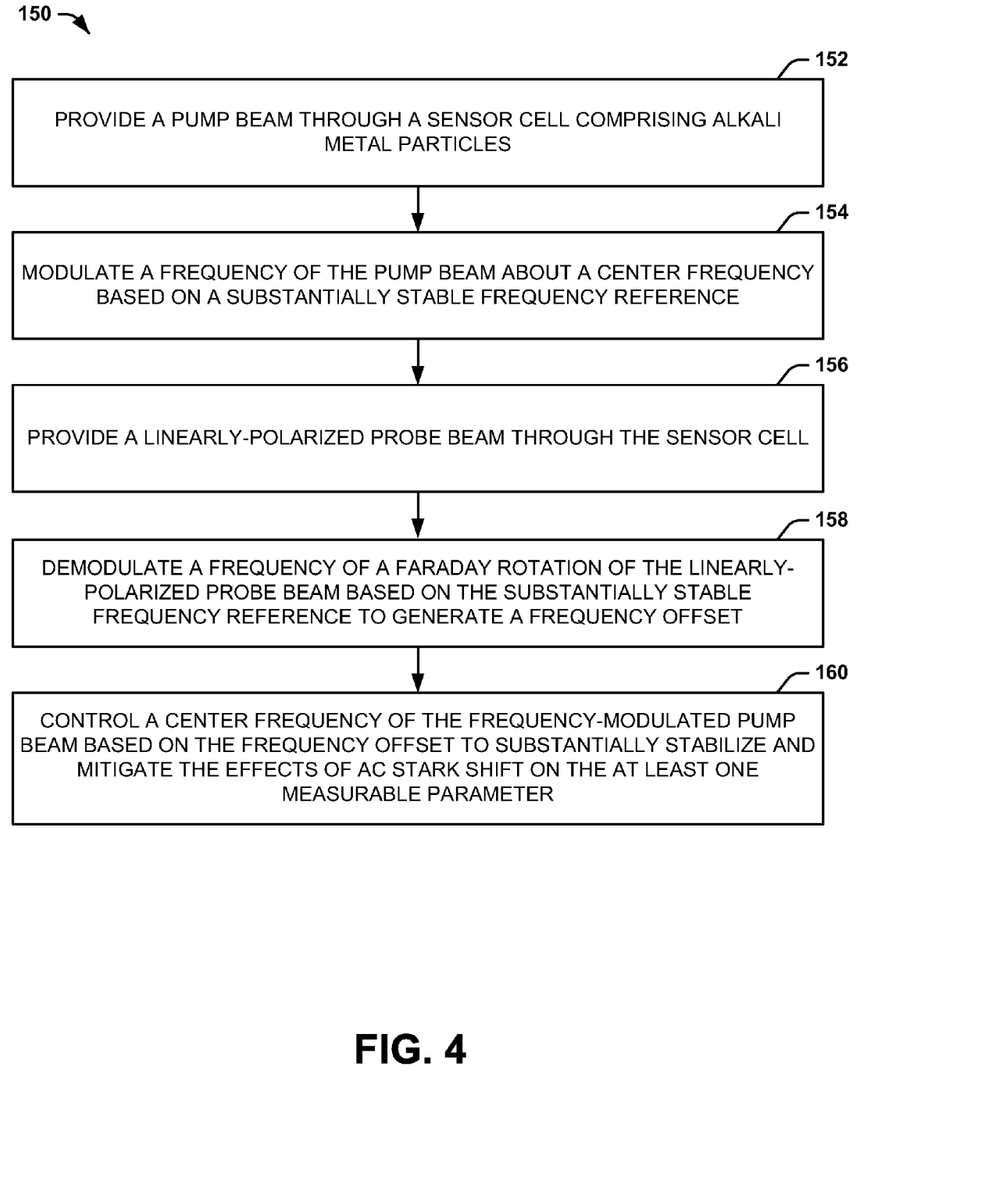
FIG. 4 illustrates an example of a method for substantially mitigating AC Stark shift effects in a sensor system in accordance with an aspect of the invention.

In view of the foregoing structural and functional features described above, a methodology in accordance with various aspects of the present invention will be better appreciated with reference to FIG. 4. While, for purposes of simplicity of explanation, the methodology of FIG. 4 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 4 illustrates an example of a method 150 for substantially mitigating AC Stark shift effects in a sensor system in accordance with an aspect of the invention. At 152, a pump beam is provided through a sensor cell comprising alkali metal particles. The optical pump beam can be generated at a linear polarization from a pump laser. The optical pump beam can be oriented at an offset angle θ relative to an applied magnetic field to induce a virtual magnetic field resulting from AC Stark shift on an alkali metal in a sensor cell having a vector component that is orthogonal to the applied magnetic field to be able to detect the AC Stark shift. At 154, a frequency of the pump beam is modulated about a center frequency based on a substantially stable frequency reference. The modulation can occur based on modulating a current associated with the pump laser based on a dither signal having a relatively low frequency (e.g., approximately between 8 and 12 kHz). The center frequency can be a frequency of substantial maximum absorption of the pump beam by the alkali metal particles, or could be a frequency that is between transition frequencies of the alkali metal particles.

At 156, a linearly-polarized probe beam is provided through the sensor cell. The probe beam can be generated by a probe laser to determine at least one measurable parameter of the sensor system based on a Faraday rotation. At 158, a frequency of a Faraday rotation of the linearly-polarized probe beam is demodulated based on the substantially stable frequency reference to generate a frequency offset. The Faraday rotation of the linearly-polarized probe beam can have a frequency that is substantially the same as the frequency-modulated pump beam based on the offset angle providing components of the pump beam in an orthogonal plane relative to an applied magnetic field, such that an AC magnetic field is induced in the orthogonal plane having a frequency that is equal to the frequency-modulated pump beam. At 160, a center frequency of the frequency-modulated pump beam is controlled based on the frequency offset to substantially stabilize and mitigate the effects of AC Stark shift on the at least one measurable parameter. The frequency offset can be determined based on a DC error signal generated from the demodulated frequency of the Faraday rotation of the linearly-polarized probe beam in a feedback manner.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A sensor system comprising:
    a cell system comprising a pump laser configured to generate a pump beam to polarize alkali metal particles enclosed within a sensor cell;
    a detection system comprising a probe laser configured to generate a probe beam, the detection system being configured to calculate at least one measurable parameter based on characteristics of the probe beam passing through the sensor cell resulting from precession of the polarized alkali metal particles in response to an applied magnetic field; and
    an AC Stark shift control system configured to frequency-modulate the pump beam and to control a center frequency of a frequency-modulated pump beam based on the characteristics of the probe beam passing through the sensor cell to substantially stabilize and mitigate the effects of AC Stark shift on the at least one measurable parameter.

2. The system of claim 1, wherein the AC Stark shift control system is configured to initially set the center frequency of the frequency-modulated pump beam between transition frequencies associated with two independent ground states of the alkali metal particles, and to control the center frequency to maintain a frequency at which the effects of the AC Stark shift are substantially equal and opposite with respect to the two independent ground states based on the characteristics of the probe beam passing through the sensor cell.

3. The system of claim 1, wherein the AC Stark shift control system comprises:
    a stabilization system configured to generate a current that is provided to the pump laser to set the frequency of the pump beam; and
    a frequency reference configured to generate a substantially stable dither frequency signal that is provided to the stabilization system to modulate the frequency of the pump beam and to demodulate a frequency of Faraday rotation of the probe beam.

4. The system of claim 3, wherein the pump laser is oriented to generate the pump beam at an offset angle with respect to the applied magnetic field to generate an induced magnetic field internal to the sensor cell that is substantially coplanar with the probe beam corresponding to the effects of the AC Stark shift, the induced magnetic field providing the frequency of the Faraday rotation of the probe beam to be approximately equal to a frequency of the substantially stable dither frequency signal.

5. The system of claim 3, wherein the stabilization system is configured to shift the center frequency of the frequency-modulated pump beam based on the demodulated frequency of the Faraday rotation of the probe beam to substantially maintain the center frequency at a frequency at which the effects of the AC Stark shift are substantially equal and opposite with respect to the two independent ground states in a feedback manner.

6. The system of claim 1, wherein the cell system further comprises a cell temperature controller configured to set a temperature of the sensor cell via a feedback temperature control signal to substantially stabilize a time-averaged optical absorption of the pump beam passing through the sensor cell in response to the monitored optical absorption of the pump beam passing through the sensor cell.

7. The system of claim 1, wherein the AC Stark shift control system is configured to modulate the frequency of the pump beam to substantially stabilize and mitigate the effects of the AC Stark shift in a time-averaged quantity of the at least one measurable parameter calculated by the detection system.

8. The system of claim 1, wherein the alkali metal particles are $^{85}$Rb particles.

9. The system of claim 1, wherein the sensor system is configured as at least one of a nuclear magnetic resonance (NMR) gyroscope, an NMR magnetometer, and an electron paramagnetic resonance (EPR) magnetometer.

10. A method for substantially mitigating AC Stark shift effects in a sensor system configured to calculate at least one measurable parameter, the method comprising:
providing a pump beam through a sensor cell comprising alkali metal particles;
modulating a frequency of the pump beam about a center frequency based on a substantially stable frequency reference;
providing a linearly-polarized probe beam through the sensor cell;
demodulating a frequency of a Faraday rotation of the linearly-polarized probe beam based on the substantially stable frequency reference to generate a frequency offset; and
controlling a center frequency of the frequency-modulated pump beam based on the frequency offset to substantially stabilize and mitigate the effects of AC Stark shift on the at least one measurable parameter.

11. The method of claim 10, further comprising:
monitoring optical absorption of the pump beam passing through the sensor cell; and
setting an initial center frequency of the frequency-modulated pump beam to a value associated with a substantial maximum optical absorption of the pump beam provided through the sensor cell.

12. The method of claim 10, wherein providing the optical pump beam through the sensor cell comprises providing the optical pump beam through the sensor cell at an offset angle with respect to an applied magnetic field to generate an induced magnetic field internal to the sensor cell that is substantially orthogonal to the applied magnetic field corresponding the effects of the AC Stark shift, the induced magnetic field providing the frequency of the Faraday rotation of the probe beam to be approximately equal to a frequency of the substantially stable frequency reference.

13. The method of claim 12, wherein providing the probe beam comprises providing the probe beam substantially coplanar with the induced magnetic field.

14. The method of claim 10, further comprising setting a temperature of the sensor cell to substantially stabilize a time-averaged optical absorption of the pump beam passing through the sensor cell in response to the monitored optical absorption of the pump beam passing through the sensor cell.

15. The system of claim 10, wherein setting the center frequency comprises setting the center frequency to a value associated with a substantial maximum optical absorption of the pump beam provided through the sensor cell, and wherein controlling the center frequency comprises maintaining the center frequency at a frequency at which the effects of the AC Stark shift are substantially equal and opposite with respect to the two independent ground states based on demodulating the frequency of a Faraday rotation of the linearly-polarized probe beam.

16. A sensor system comprising:
a cell system comprising a pump laser configured to generate a pump beam having a frequency that is based on a magnitude of a current to polarize alkali metal particles enclosed within a sensor cell;
a detection system comprising a probe laser configured to generate a probe beam, the detection system being configured to calculate at least one measurable parameter based on characteristics of the probe beam passing through the sensor cell resulting from precession of the polarized alkali metal particles in response to an applied magnetic field; and
an AC Stark shift control system configured to monitor an absorption voltage corresponding to optical absorption of the pump beam passing through the sensor cell to determine a substantial maximum optical absorption of the pump beam passing through the sensor cell, the AC Stark shift control system being further configured to modulate the magnitude of the current to frequency-modulate the pump beam based on a substantially stable frequency reference and to control a center frequency of the frequency-modulated pump beam based on a Faraday rotation of the probe beam passing through the sensor cell to substantially stabilize and mitigate the effects of AC Stark shift on the at least one measurable parameter.

17. The system of claim 16, wherein the AC Stark shift control system is further configured to demodulate a frequency of the Faraday rotation of the probe beam passing through the sensor cell based on the substantially stable frequency reference to generate a DC offset corresponding to a deviation of the center frequency from a frequency at which the effects of the AC Stark shift are substantially equal and opposite with respect to the two independent ground states, the AC Stark shift control system being further configured to shift the center frequency based on the DC offset in a feedback manner.

18. The system of claim 16, wherein the pump laser is oriented to generate the pump beam at an offset angle with respect to the applied magnetic field to generate an induced magnetic field internal to the sensor cell that is substantially coplanar with the probe beam corresponding to the effects of the AC Stark shift, the induced magnetic field providing the frequency of the Faraday rotation of the probe beam to be approximately equal to a frequency of the substantially stable frequency reference.

19. The system of claim 16, wherein the cell system further comprises a cell temperature controller configured to set a temperature of the sensor cell via a feedback temperature control signal to substantially stabilize a time-averaged optical absorption of the pump beam passing through the sensor cell in response to the monitored optical absorption of the pump beam passing through the sensor cell.

20. The system of claim 16, wherein the alkali metal particles are $^{85}$Rb particles.

* * * * *